United States Patent [19]
Ushiroku

[11] Patent Number: 5,999,069
[45] Date of Patent: Dec. 7, 1999

[54] SURFACE ACOUSTIC WAVE LADDER FILTER HAVING A PARALLEL RESONATOR WITH A LARGER ELECTROSTATIC CAPACITANCE

[75] Inventor: Tadamasa Ushiroku, Ishikawa-ken, Japan

[73] Assignee: Murata Manufacturing Co., Ltd., Japan

[21] Appl. No.: 09/118,957

[22] Filed: Jul. 17, 1998

[30] Foreign Application Priority Data

Aug. 7, 1997 [JP] Japan .................................. 9-213412

[51] Int. Cl.$^6$ ............................................. H03H 9/64
[52] U.S. Cl. ............................................ 333/193; 333/195
[58] Field of Search .................................... 333/193–196

[56] References Cited

U.S. PATENT DOCUMENTS

| | | | |
|---|---|---|---|
| 5,559,481 | 9/1996 | Satoh et al. | 333/193 |
| 5,561,406 | 10/1996 | Ikata et al. | 333/193 X |
| 5,844,453 | 12/1998 | Matsui et al. | 333/193 |

FOREIGN PATENT DOCUMENTS

| | | | |
|---|---|---|---|
| 0740411 | 10/1996 | European Pat. Off. | 333/193 |
| 56-19765 | 5/1981 | Japan . | |
| 5-183380 | 7/1993 | Japan . | |
| 07264000 | 10/1995 | Japan | 333/195 |

*Primary Examiner*—Benny Lee
*Assistant Examiner*—Barbara Summons
*Attorney, Agent, or Firm*—Graham & James LLP

[57] ABSTRACT

A surface acoustic wave filter has a ladder type filter circuit including a plurality of series arm resonators and a plurality of parallel arm resonators. The electrostatic capacitance of at least one of the parallel arm resonators is larger than that of another of the parallel arm resonators, and the length of a bonding wire connecting the parallel arm resonator having the larger electrostatic capacitance to a ground potential of a package is greater than that of a bonding wire connecting the another of the parallel arm resonators not having the larger electrostatic capacitance to the ground potential, such that the values of additional inductances created by the bonding wires are different from each other. In this manner, attenuation poles are distributed so that the amount of attenuation in the stop band on the low-frequency side is greatly increased.

12 Claims, 10 Drawing Sheets

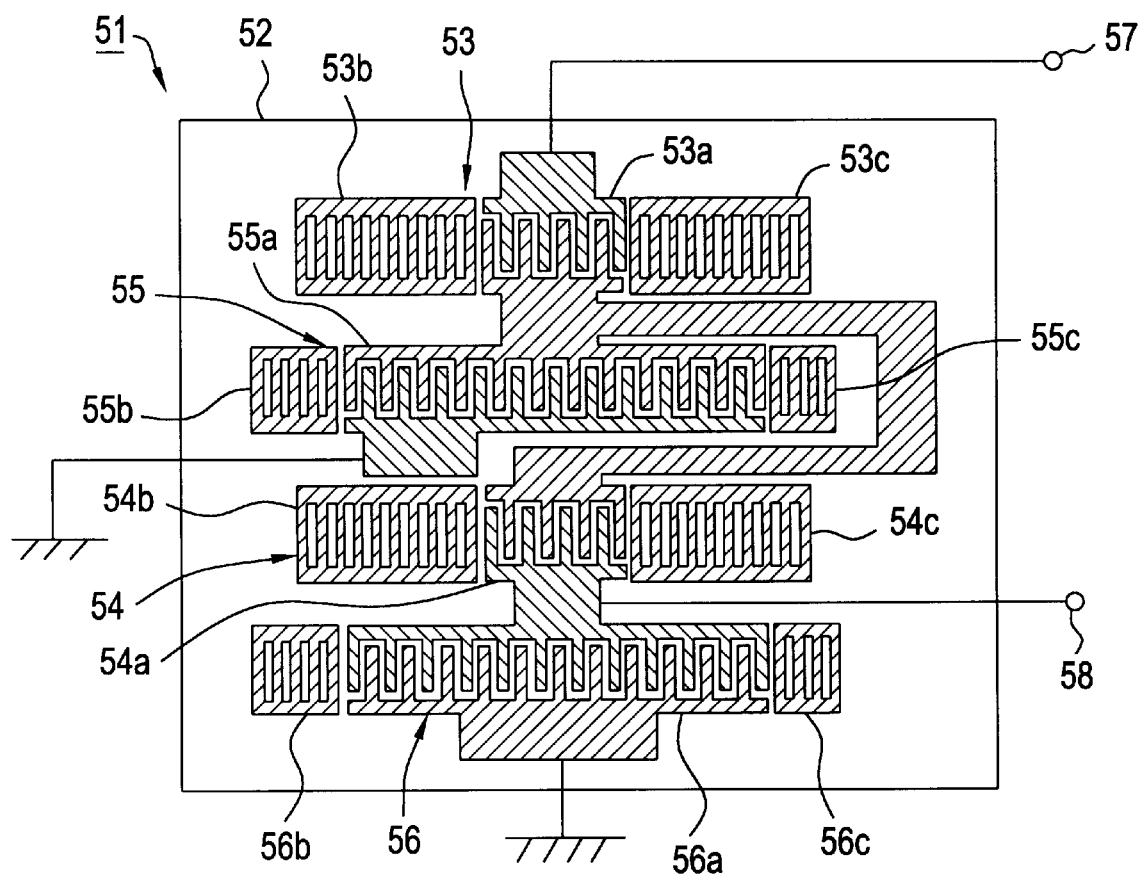

SURFACE ACOUSTIC WAVE LADDER FILTER HAVING A PARALLEL RESONATOR WITH A LARGER ELECTROSTATIC CAPACITANCE

BACKGROUND OF THE INVENTION

1. Field of the Invention

The present invention relates to a surface acoustic wave filter having a plurality of SAW resonators arranged on a piezoelectric substrate and, more particularly, to a surface acoustic wave filter having a plurality of SAW resonators arranged so as to define a ladder type filter circuit.

2. Description of the Related Art

A surface acoustic wave filter having a plurality of SAW resonators arranged on a piezoelectric substrate is known, for example, as a high-frequency band filter for use in mobile communication apparatuses. For example, Japanese Patent Publication (Kokoku) No. 56-19765 discloses a surface acoustic wave filter having a ladder type filter circuit including a plurality of SAW resonators on a piezoelectric substrate.

FIG. 11 is a schematic plan view for explaining a surface acoustic wave filter disclosed in the above-mentioned prior art.

A surface acoustic wave filter 51 includes a rectangular piezoelectric substrate 52, on which a plurality of SAW resonators are arranged to define series arm resonators 53 and 54 and parallel arm resonators 55 and 56. That is, the series arm resonators 53 and 54 are connected in series in a series arm between an input terminal 57 and an output terminal 58. Also, parallel arm resonators 55 and 56 are connected between the series arm and a ground potential. The series arm resonators 53 and 54 and the parallel arm resonators 55 and 56 are alternately disposed between the input and output terminals 57, 58.

In the surface acoustic wave filter 51, the series arm resonators 53 and 54 and the parallel arm resonators 55 and 56 are constructed in such a manner that interdigital transducers (hereinafter referred to as IDTs) 53a, 54a, 55a, and 56a are provided at the centers of the series and parallel arm resonators, respectively, and reflectors 53b and 53c, 54b and 54c, 55b and 55c, and 56b and 56c are provided on the opposite sides of the IDTs 53a–56a. That is, in the surface acoustic wave filter 51, each of the series arm resonators 53 and 54 and the parallel arm resonators 55 and 56 is comprised of a one-port SAW resonator having reflectors on the opposite sides of an IDT.

The principle of the operation of the above-described surface acoustic wave filter 51 is as described below.

Referring to FIG. 12 in which only electrode portions are schematically shown, a one port SAW resonator 60 has a structure in which reflectors 62 and 63 are placed on the opposite sides of an IDT 61 located at a center thereof. The IDT 61 has a structure in which a comb-shaped electrode 61a having at least one electrode finger and a comb-shaped electrode 61b having at least one electrode finger are arranged so that their electrode fingers interdigitate with each other.

In the one port SAW resonator 60, surface acoustic waves excited by the IDT 61 are reflected by the reflectors 62 and 63 to form standing waves confined between the reflectors 62 and 63. The SAW resonator 60 therefore operates as a resonator having a large Q value. As is well-known, in the impedance characteristics of the SAW resonator 60, a pole of a lower impedance exists in the vicinity of a resonant frequency fr while a pole of a higher impedance appears at an antiresonant frequency fa.

In the surface acoustic wave filter 51, a passband is obtained by utilizing the impedance characteristics of the one port SAW resonators described above. More specifically, the resonant frequencies fr of the series arm resonators 53 and 54 and the antiresonant frequencies fa of the parallel arm resonators 55 and 56 are set equal to each other to match the output and input impedances with the characteristic impedance at about the resonant and antiresonant frequencies which are equal to each other, thus setting a passband.

Because the one port SAW resonator has the above-described impedance characteristic, very high impedances result at the antiresonant frequencies of the series arm resonators 53 and 54 while very low impedances result at the resonant frequencies of the parallel arm resonators 55 and 56. In the surface acoustic wave filter 51, therefore, attenuation regions are defined with poles corresponding to these frequencies.

The surface acoustic wave filter 51 has the series arm resonators 53 and 54 and the parallel arm resonators 55 and 56 arranged as described above and, therefore, can be designed so as to reduce insertion loss and can achieve a comparatively large amount of attenuation in the vicinity of the passband.

Japanese Patent laid-Open Publication No. 5-183380 also discloses a surface acoustic wave filter arranged in the same manner as the surface acoustic wave filter 51 and has an inductance added to the parallel arm resonators to achieve a wide frequency range.

In recent years, there has been a strong demand for expanding transmitting and receiving frequency bands of mobile communication apparatuses such as portable telephones. As a result, widening of the frequency band has also been demanded with respect to band filters used in such apparatuses. Moreover, an increase in the amount of attenuation in rejection regions of band filters for use in such apparatuses is strongly demanded. That is, there is a need to obtain a large amount of attenuation in a receiving frequency band in a transmitting filter as well as in a transmitting frequency band in a receiving filter.

In band filters for mobile communication apparatuses, the frequencies of the above-mentioned rejection regions are in the vicinity of a passband. Surface acoustic wave filters having a ladder type circuit operate based on the above-described principle and, therefore, have a comparatively large amount of attenuation in the vicinity of a passband. Thus, surface acoustic wave filters having a ladder type circuit configuration have characteristic suitable for a band filter of mobile communication apparatuses.

Surface acoustic wave filters having a ladder type circuit achieve a very large amount of attenuation at an attenuation pole. However, since the frequency range of the attenuation pole is narrow, the amount of attenuation decreases abruptly with deviation from the frequency of the attenuation pole. That is, a large amount of attenuation is obtained at the frequency of the attenuation pole in a rejection region in the vicinity of a passband, but an increase in the frequency range in which the amount of attenuation is large is strongly demanded since the frequency range in which the amount of attenuation is large is comparatively narrow.

Conventionally, the method (1) of increasing the ratio of the capacitances of a parallel arm resonator and a series arm resonator and the method (2) of distributing a plurality of attenuation poles by using a plurality of parallel arm resonators and setting the resonant frequencies of the parallel arm resonators to be different from each other have been tried as a method for extending the frequency range of a large-attenuation portion in a rejection region of a surface acoustic wave filter having a ladder type circuit.

However, the method (1) of increasing the amount of attenuation by the capacitance ratio causes an increase in insertion loss, and the method (2) of setting different resonant frequencies of a plurality of parallel arm resonators causes a failure of impedance matching in a passband, which results in an increase in reflection loss.

That is, as long as the conventional methods for increasing the frequency band in which the amount of attenuation is large are used, there is a limit to the advantageous effect of such methods because of an increase in insertion loss and reflection loss in addition to a failure of impedance matching.

SUMMARY OF THE INVENTION

The preferred embodiments of the present invention overcome the problems described above by providing a surface acoustic wave filter having a ladder type filter circuit which is designed to extend the frequency band in which the amount of attenuation is large in a rejection region on the low-frequency side of a passband without increasing the insertion loss.

The preferred embodiments of the present invention also provide a surface acoustic wave filter including a surface acoustic wave filter element having series arm resonators and parallel arm resonators disposed on a piezoelectric substrate and arranged to define a ladder type filter circuit having a series arm located between input and output terminals and a plurality of parallel arms located between the series arm and a ground potential, a package having the surface acoustic wave filter element contained therein and having a plurality of external terminals connected to the surface acoustic wave filter element, and a plurality of bonding wires which respectively connect the input and output terminals and a ground potential terminal of the surface acoustic wave filter element to the plurality of external terminals of the package. The electrostatic capacitance of at least one of the plurality of parallel arm resonators is larger than the electrostatic capacitance of the other parallel arm resonators, and the length of the bonding wire connected between the parallel arm resonator having the larger electrostatic capacitance and the external terminal provided on the package and connected to the ground potential is greater than the length of the bonding wires connected between the other parallel arm resonators having the smaller electrostatic capacitance and the external terminals provided on the package and connected to the ground potential.

In a preferred embodiment, the surface acoustic wave filter element has a plurality of series arm resonators and a plurality of parallel arm resonators, a first parallel arm resonator in the parallel arm resonators being provided in a parallel arm connected to a connection point between the input terminal or output terminal of the surface acoustic wave filter element and one of the series arm resonators located close to the input or output terminal, a second parallel arm resonator in the parallel arm resonators being provided in a parallel arm connected to a connection point between the series arm resonators, and the electrostatic capacitance of the second parallel arm resonator is larger than the electrostatic capacitance of the first parallel arm resonator.

In another preferred embodiment, the first parallel arm resonator is provided in each of the parallel arms connected to the connection point between the input terminal and the series arm resonator close to the input terminal and the parallel arm connected to the connection point between the output terminal and the series arm resonator close to the output terminal, and the electrostatic capacitance of the second parallel arm resonator is larger than a value which is twice the electrostatic capacitance of the first parallel arm resonator and not larger than a value that is six times larger than the electrostatic capacitance of the first parallel arm resonator.

In still another preferred embodiment, the length of the bonding wire connecting the second parallel arm resonator and the external terminal provided on the package and connected to the ground potential is greater than the length of the bonding wire connecting the first parallel arm resonator and the external terminal provided on the package and connected to the ground potential, thereby further extending the frequency through which the amount of attenuation is large.

According to preferred embodiments of the present invention, the electrostatic capacitances of the plurality of parallel arm resonators are different from each other, and the length of the bonding wire connecting the parallel arm resonator having the larger electrostatic capacitance to the ground potential is greater than the length of the bonding wires connecting the other parallel arm resonators to the ground potential, so that the inductances inserted in series with the parallel arm resonators with the bonding wires having different lengths are different from each other. In this manner, the frequency range in which the amount of attenuation is large in the rejection region on the low-frequency side of the passband is greatly increased. Also, in the above-described novel arrangement, the antiresonant frequencies of the parallel arm resonators in the passband are not changed, so that a deterioration in the passband characteristics is prevented.

Thus, the frequency range in which the amount of attenuation is large in the rejection region on the low-frequency side of the passband is greatly increased without causing a deterioration in passband characteristics. Therefore, the surface acoustic wave filter of preferred embodiments of the present invention can be suitably used as, for example, a transmitting or receiving filter for a mobile communication apparatus.

The arrangement of the surface acoustic wave filter of preferred embodiments of the present invention may be such that the surface acoustic wave filter element has a plurality of series arm resonators and a plurality of parallel arm resonators, and parallel arms connected to connection points between the input and output terminals and the series connectors close to the input and output terminals, and the electrostatic capacitance of the second parallel arm resonator provided in the parallel arm connected to the connection point between the series arm resonators is larger than that of the first parallel arm resonators inserted in the parallel arms located close to the input and output terminals, thereby increasing the frequency range in which the amount of attenuation is large in the rejection region on the low-frequency side of the passband.

In another example of preferred embodiments of the present invention, the electrostatic capacitance of the second parallel arm resonator is preferably larger than a value that is twice the electrostatic capacitance of the first parallel arm resonator and not larger than a value that is six times larger than the electrostatic capacitance of the first parallel arm resonator. The increase in VSWR is thereby limited while the frequency range through which the amount of attenuation is large in the rejection region on the low-frequency side of the passband is further increased. In this manner, the frequency range in which the amount of attenuation is large in the rejection region on the low-frequency side of the passband is greatly increased without excessively increasing the size of the bonding wire connected to the second parallel arm resonator. This arrangement therefore contributes to the reduction in the size of surface acoustic wave filters.

In addition, the length of the bonding wire connecting the second parallel arm resonator to the ground potential is preferably greater than the length of the bonding wire connecting the first parallel arm resonator to the ground potential, thereby making it possible to further increase the frequency range in which the amount of attenuation is large in the rejection region on the low-frequency side of the passband.

For the purpose of illustrating preferred embodiments of the present invention, there is shown in the drawings several forms which are presently preferred, it being understood, however, that the invention is not limited to the precise arrangements and instrumentalities shown.

BRIEF DESCRIPTION OF THE DRAWINGS

FIG. 11 is a schematic plan view showing an example of a conventional surface acoustic wave filter.

DETAILED DESCRIPTION OF PREFERRED EMBODIMENTS

Hereinafter, the preferred embodiments of the present invention are explained in detail with reference to the drawings.

Figure 1:
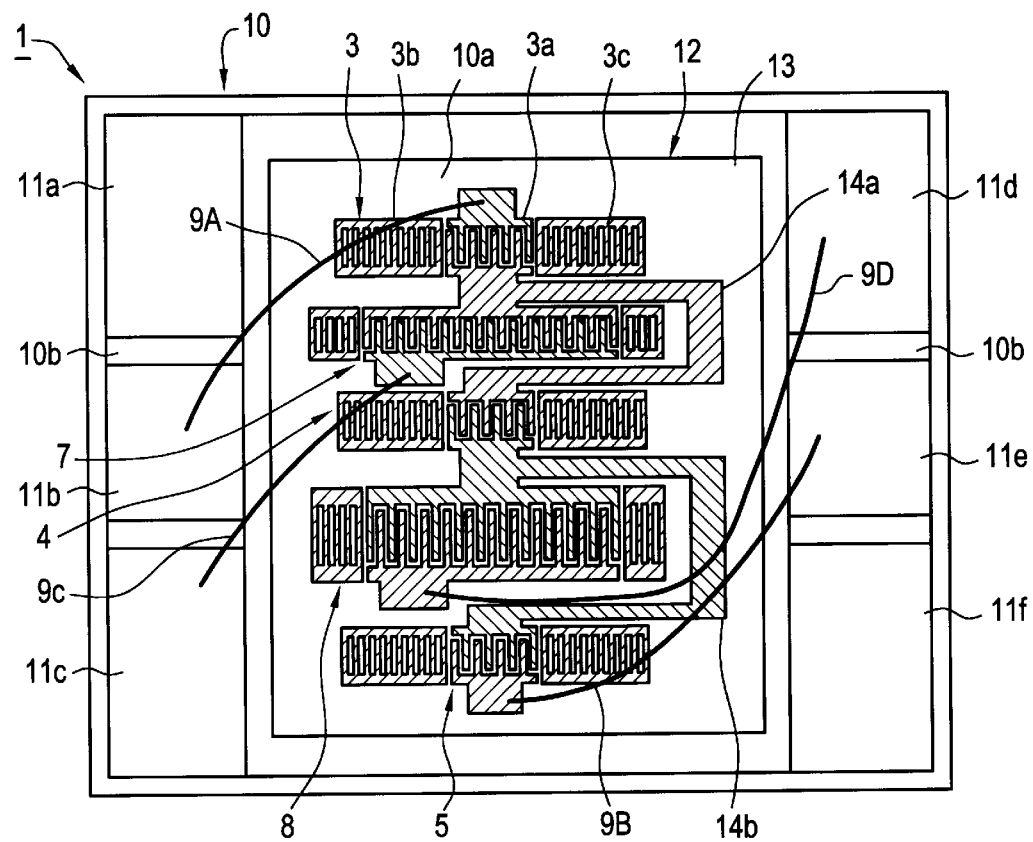
FIG. 1 is a schematic plan view showing an example of the structure of a surface acoustic wave filter in accordance with a preferred embodiment of the present invention.
Figure 2:
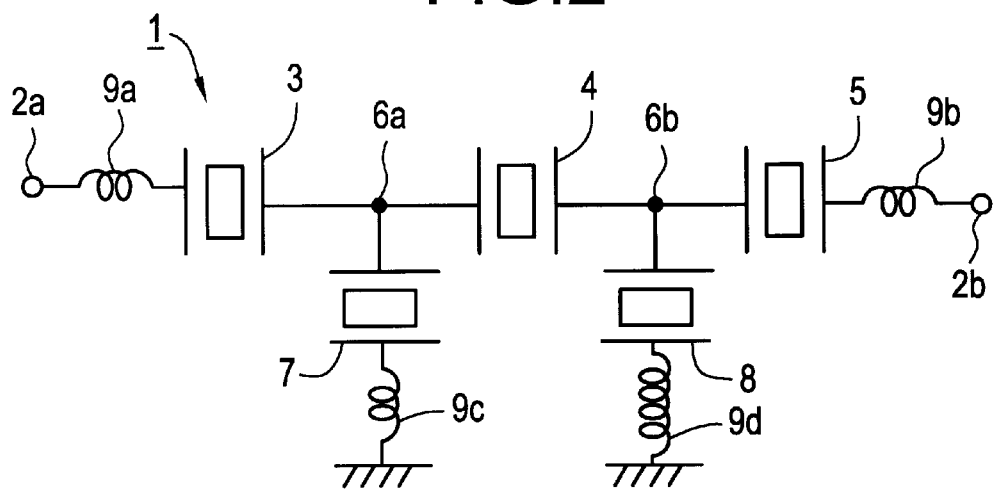
FIG. 2 is a diagram showing an equivalent circuit of the surface acoustic wave filter shown in FIG. 1.

FIG. 1 is a schematic plan view showing an example of the structure of a surface acoustic wave filter in accordance with preferred embodiments of the present invention, and FIG. 2 is a diagram showing an equivalent circuit of the surface acoustic wave filter shown in FIG. 1.

As shown in FIG. 2, a surface acoustic wave filter 1 has a series arm including series arm resonators 3, 4, and 5 located between an input terminal 2a and an output terminal 2b. A first parallel arm is located between a connection point 6a located between the series arm resonators 3 and 4, and a parallel arm resonator 7 is inserted in this first parallel arm. A second parallel arm is also defined between a connection point 6b located between the series arm resonators 4 and 5, and a parallel arm resonator 8 is inserted in this second parallel arm.

As is apparent from a structural example described below, the series arm resonators 3, 4, and 5 and the parallel arm resonators 7 and 8 are connected preferably via bonding wires to external terminals for connection to components outside of a package. In this structural example, inductances 9a–9d created by the bonding wires are inserted respectively in series with the resonators.

That is, inductance 9a is inserted in series with the series arm resonator 3 by the bonding wire connecting the series arm resonator 3 and the input terminal 2a, and inductance 9b is inserted in series with the series arm resonator 5 by the bonding wire connecting the series arm resonator 5 and the output terminal 2b. Similarly, inductances 9c and 9d are respectively inserted by the bonding wires connecting the parallel arm resonators 7 and 8 to external terminals on the package connected to a ground potential.

In the surface acoustic wave filter 1, the electrostatic capacitances of the parallel arm resonators 7 and 8 are different from each other and more specifically, the electrostatic capacitance of the parallel arm resonator 8 is preferably larger than that of the parallel arm resonator 7. Also, the bonding wire for creating the inductance 9d is increased in size or length so that the inductance 9d created by the bonding wire connecting the parallel arm resonator 8 to the ground potential is larger than the inductance 9c created by the bonding wire connecting the parallel arm resonator 7 to the ground potential.

The detailed structure of the surface acoustic wave filter 1 shown in FIG. 2 will now be described with reference to FIG. 1.

In the surface acoustic wave filter 1, a surface acoustic wave filter element 12 is placed in a central opening of the package 10. A lid member (not shown) is attached to the package 10 so as to close the central opening 10a to enclose the surface acoustic wave filter element 12 in the package structure, although this state is not specially illustrated.

The package 10 is preferably formed of a suitable insulating material, e.g., an insulating ceramic such as alumina or a synthetic resin. Stepped portions 10b are formed on the opposite sides of the opening 10a of the package 10 and external terminals 11a–11f are located on the stepped portions 10b.

The external terminals 11a–11f are preferably formed of a thin or thick film made of an electroconductive material such as copper or aluminum, and are arranged so as to extend from the positions on the stepped portions 10b to outer side surfaces of the package 10 and arranged to be externally connected electrically from the outer side surfaces, although the extensions of the terminals 11a–11f are not clearly shown in FIG. 1.

The external terminals 11a–11f are connected via the bonding wires to the resonators of the surface acoustic wave filter 12 described below.

The surface acoustic wave filter 12 preferably includes a substantially rectangular piezoelectric substrate 13. The piezoelectric substrate 13 may be formed of a piezoelectric single crystal of LiNbO$_3$, LiTaO$_3$ or quartz, or a piezoelectric ceramic such as lead titanate zirconate piezoelectric ceramic. Alternatively, a composite substrate in which a piezoelectric thin film made of one of these materials is formed on an appropriate substrate may be used as a piezoelectric substrate 13. In this structural example, the piezoelectric substrate 13 is preferably formed of a 36°Y-cut LiTaO$_3$ substrate.

On the piezoelectric substrate 13, the series arm resonators 3–5 and the parallel arm resonators 7 and 8 are preferably formed of an electroconductive material, e.g., Al or other suitable metal or material. The series arm resonator 3 is preferably a one port SAW resonator having an IDT 3a including electrode fingers arranged to be interdigitated with each other, and reflectors 3b and 3c placed on the opposite sides of the IDT 3a. Similarly, each of the series arm resonators 4 and 5 has an IDT and reflectors placed on the opposite sides of the IDT. Further, each of the parallel arm resonators 7 and 8 has an IDT and reflectors placed on the opposite sides of the IDT.

In the surface acoustic wave filter 1, the external terminal 11b of the external terminals 11a–11f is used as an input terminal while the external terminal 11e is used as an output terminal. One of the pair of comb-shaped electrodes of the IDT 3a of the series arm resonator 3 is connected to the external terminal 11b via the bonding wire 9A. The series arm resonators 3 and 4 are connected by an electroconductive pattern 14a while the series arm resonators 4 and 5 are connected by an electroconductive pattern 14b. One of the pair of comb-shaped electrodes of the IDT of the series arm resonator 5 is connected to the external terminal 11e by the bonding wire 9B. Thus, the series arm is formed between the external terminal 11b used as an input terminal and the external terminal 11e used as an output terminal, and the series arm resonators 3, 4, and 5 are inserted in the series arm.

On the other hand, the parallel arm resonator 7 is connected between the ground potential and the connection point between the series arm resonators 3 and 4. This connection of the parallel arm resonator 7 and the ground potential is made by connecting one of the pair of comb-shaped electrodes of the IDT to the external terminal 11c connected to the ground potential via the bonding wire 9C. Further, the parallel arm resonator 8 is connected between the ground potential and the connection point between the series arm resonators 4 and 5. The connection of the parallel arm resonator 8 and the ground potential is made by connecting one of the pair of comb-shaped electrodes of the IDT of the parallel arm resonator 8 to the external terminal 11d connected to the ground potential via the bonding wire 9D.

Thus, in the surface acoustic wave filter 1, the inductances 9a–9d shown in FIG. 2 are created by the above-described bonding wires 9A–9D. In addition, the electrostatic capacitance of the parallel arm resonator 8 is preferably larger than that of the parallel arm resonator 7. In this example, the electrostatic capacitance of the parallel arm resonator 8 is preferably about 2.5 times larger than that of the parallel arm resonator 7 which is achieved by setting the overlap length of the electrode fingers in the IDT of the parallel arm resonator 8 to be about 2.5 times larger than that in the parallel arm resonator 7. Note that an electrostatic capacitance of a resonator is proportional to a multiple of the overlap length and number of pairs of the electrode fingers. Thus, the number of pairs of electrode fingers may be increased.

Also, the bonding wire 9D is preferably longer than the bonding wire 9C. As a result, the inductance 9d shown in FIG. 2 is larger than the inductance 9c.

The electrostatic capacitance may be changed by changing the number of pairs of electrode fingers so as to make the electrostatic capacitances of a plurality of parallel arm resonators different from each other. Alternatively, a plurality of SAW resonators having the same frequency may be connected in series or parallel with each other to form one parallel arm resonator, enabling adjustment of the electrostatic capacitance of the parallel arm resonator. That is, according to preferred embodiments of the present invention, it is not always necessary for each parallel arm resonator to be formed of one SAW resonator.

A description will next be given of the effect of increasing the frequency range in which the amount of attenuation is large in the rejection region on the low-frequency side of a passband by making the electrostatic capacitances of the parallel arm resonators 7 and 8 different from each other and by increasing the length of the bonding wire 9D so as to be longer than that of the bonding wire 9C in the surface acoustic wave filter 1.

Figure 3:
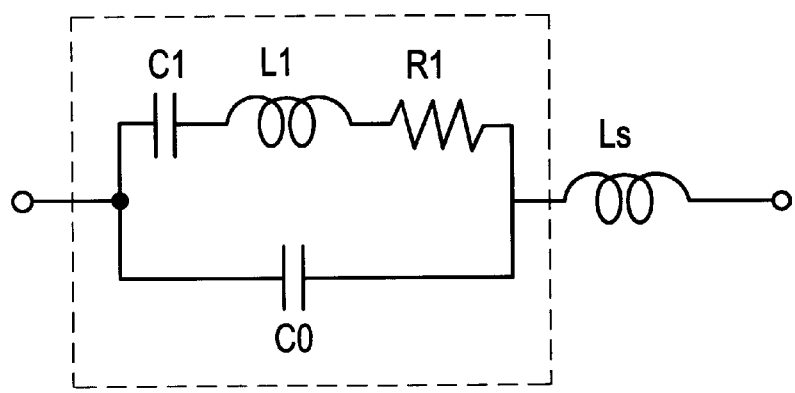
FIG. 3 is a diagram for explaining an equivalent circuit of a one port SAW resonator.

FIG. 3 shows an equivalent circuit of the one-port type SAW resonator. In FIG. 3, L1, C1 and R1 respectively designate an inductance component, a capacitance component and a resistance component representing resonance when a surface acoustic wave is excited. C0 designates the interelectrostatic capacitance of the IDT, and Ls designates an external inductance connected to the resonator. If no external inductance Ls exists, the resonant frequency fr and the antiresonant frequency fa of the resonator are expressed by the following equations (1) and (2) by ignoring the resistance component R1.

$$fr = \frac{1}{2\pi\sqrt{C1 \cdot Ls}} \quad (1)$$

$$fa = \frac{1}{2\pi\sqrt{\left(\frac{C1 \cdot Co}{C1 + Co}\right)L1}} \quad (2)$$

On the other hand, when the external inductance Ls is inserted, the resonant frequency fr' is defined by the following equation (3).

$$fr' = \frac{1}{2\pi\sqrt{C1(L1 + Ls)}} \quad (3)$$

As is apparent from equation (3), the resonant frequency can be reduced by adding the external inductance Ls. On the other hand, the antiresonant frequency fa is not changed even when the external inductance Ls is added since it is as expressed in equation (2).

A change Δfr=(fr'−fr) in the resonant frequency caused by insertion of the external inductance Ls is shown by the following equation (4).

$$\Delta fr = fr \left\{ 1 - \frac{1}{\sqrt{1 + \frac{Ls}{Ll}}} \right\} \quad (4)$$

As is apparent from equation (4), the change $\Delta fr$ in the resonant frequency becomes larger if the equivalent inductance $L1$ of the SAW resonator becomes smaller, or if the external inductance $Ls$ becomes larger. On the other hand, to reduce the equivalent inductance $L1$, the impedance of the SAW resonator may be reduced. Accordingly, equivalent inductance $L1$ can be reduced by increasing the electrostatic capacitance of the resonator. With respect to the external inductance $Ls$, the above-mentioned inductance of the bonding wire is necessarily introduced. Therefore, the external inductance $Ls$ can be increased by increasing the length of the bonding wire. With respect to the antiresonant frequency, no change is caused in the characteristic in the passband even if the length of the bonding wire is increased because the antiresonant frequency is not changed by the value of the external inductance $Ls$ as mentioned above.

Therefore, the surface acoustic wave filter 1 having a plurality of parallel arm resonators is designed to increase the frequency range in which the amount of attenuation is large by making the resonant frequencies of the parallel arm resonators different from each other so that attenuation poles corresponding to the resonant frequencies are suitably distributed in the rejection region on the low-frequency side of the passband. Moreover, the electrostatic capacitance of the parallel arm resonator 8 is preferably made larger than that of the parallel arm resonator 7 and the length of the bonding wire 9D is preferably greater than that of the bonding wire 9C, thereby obtaining a resonant frequency difference $\Delta fr$, as described above. Therefore, while the frequency range in which the amount of attenuation is large on the low-frequency side of the passband is extended, the antiresonant frequencies are not changed. Thus, it is possible to extend the frequency range in which the amount of attenuation is large in the rejection region without influencing the characteristics of the passband.

Figure 4:
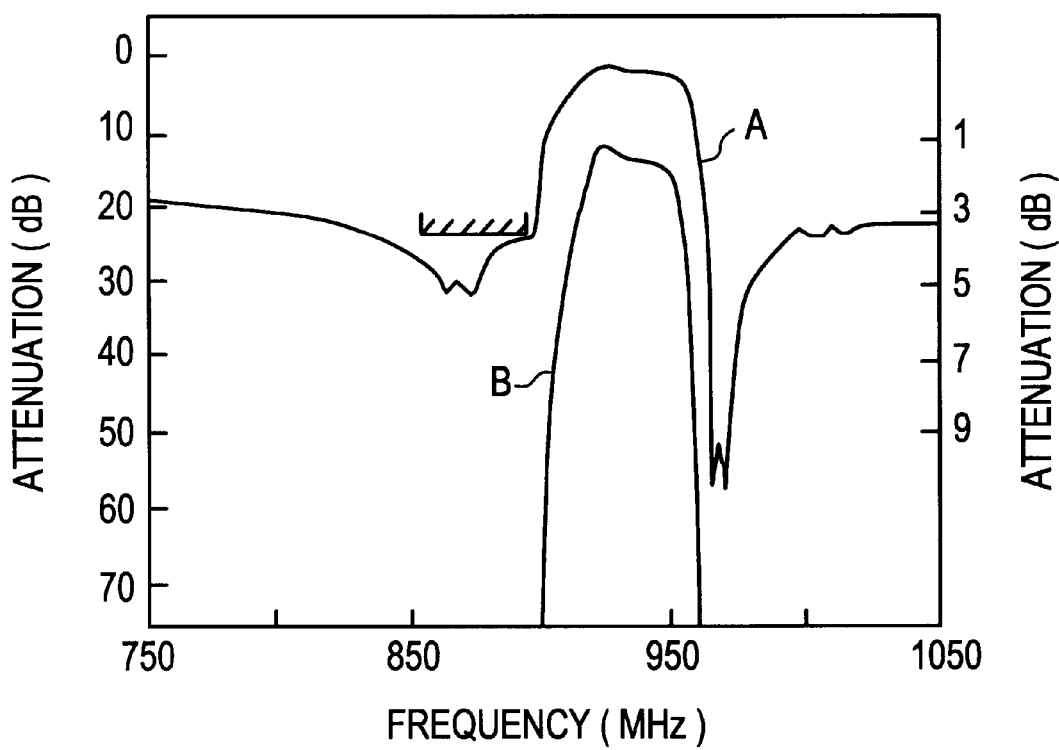
FIG. 4 is a diagram showing an attenuation-frequency characteristic of the surface acoustic wave filter shown in FIG. 1.

In FIG. 4, solid line A represents an attenuation-frequency characteristic of the surface acoustic wave filter 1 and solid line B represents an essential portion of the characteristic curve which has been enlarged based on the scale on the right-hand side. The characteristic shown in FIG. 4 was obtained by setting the following conditions in the surface acoustic wave filter 1: the number of pairs of electrode fingers of series arm resonators 3 and 5 was 100, the overlap length of the electrode fingers of series arm resonators 3 and 5 was about 130 $\mu$m, the number of pairs of electrode fingers of series arm resonator 4 was 70, the overlap length of the electrode fingers of series arm resonator 4 was 100 $\mu$m, the number of pairs of electrode fingers of parallel arm resonator 7 was 60, the overlap length of the electrode fingers of parallel arm resonator 7 was about 90 $\mu$m, the interelectrostatic capacitance of parallel arm resonator 7 was about 2.5 pF, the number of pairs of electrode fingers of parallel arm resonator 8 was 60, the overlap length of the electrode fingers of parallel arm resonator 8 was 230 $\mu$m, the interelectrostatic capacitance of parallel arm resonator 8 was 6.3 pF, the length of bonding wire 9C was about 2 mm, and the length of bonding wire 9D was about 1 mm.

Figure 13:
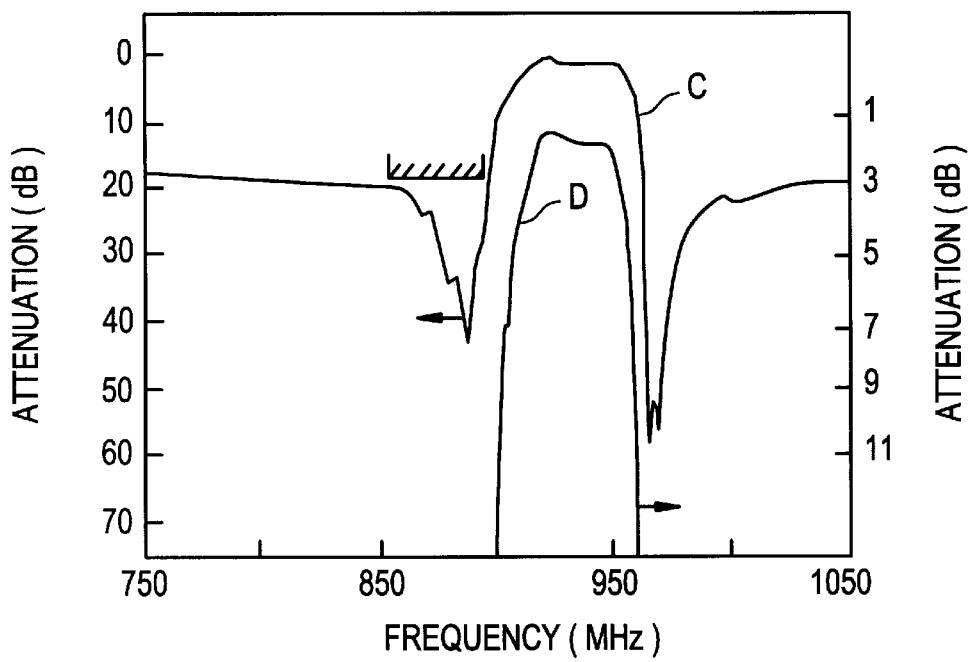
FIG. 13 is a diagram showing an attenuation-frequency characteristic of a surface acoustic wave filter according to a comparative example.

For comparison, an attenuation-frequency characteristic of a surface acoustic wave filter in which the parallel arm resonator 8 is formed so as to be the same and have the same electrostatic capacitance as that of parallel arm resonator 7 and in which bonding wires 9C and 9D have the same length, about 1 mm, is indicated by solid line C in FIG. 13, and an essential portion of the characteristic curve enlarged based on the scale on the right-hand side of FIG. 13 is indicated by solid line D. In comparison between the attenuation-frequency characteristic shown in FIG. 4 and the attenuation-frequency characteristic shown in FIG. 13, it can be understood that the amount of attenuation can be increased by about 5 dB in the rejection region on the low-frequency side of the passband while the frequency range of an attenuation amount of about 23 dB can be extended by about 40%. That is, although the amount of attenuation is reduced at the attenuation poles, the minimum of the amount of attenuation can be increased in the frequency range of the required rejection region.

Figure 5:
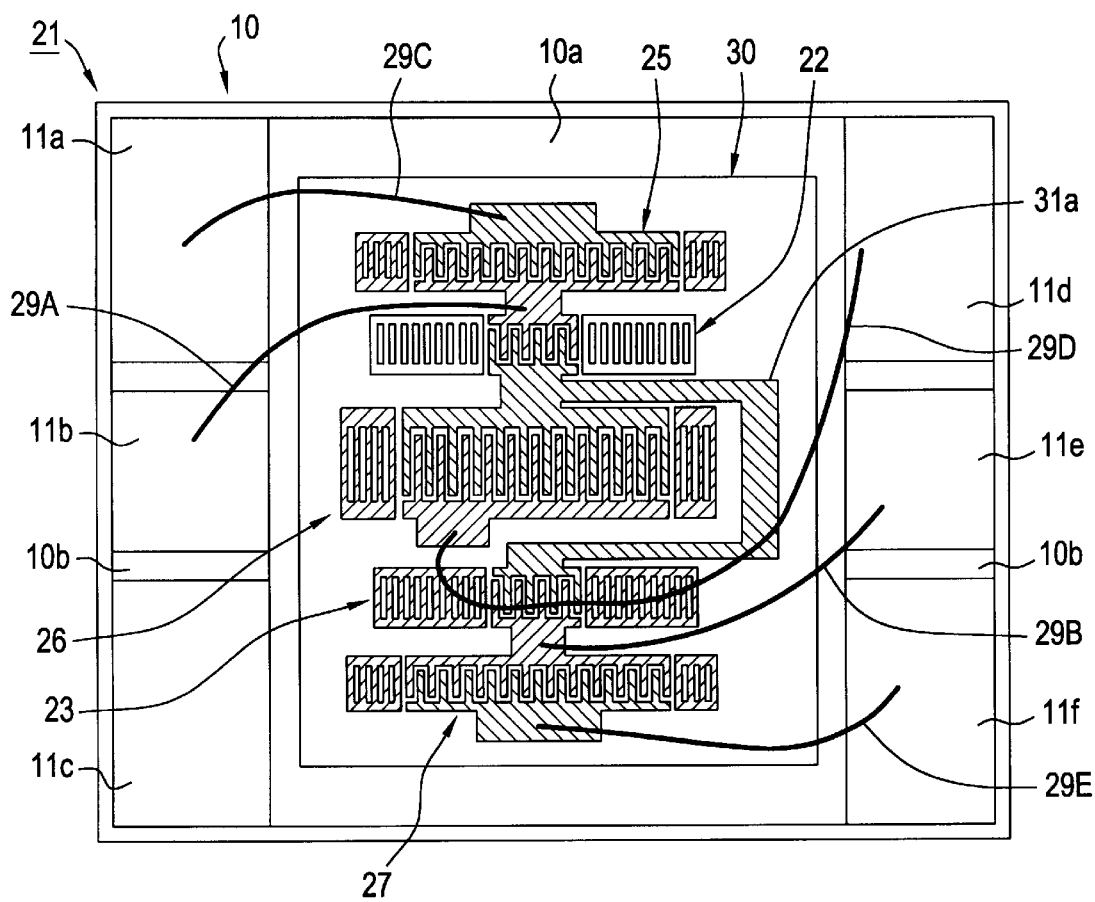
FIG. 5 is a schematic plan view for explaining a second example of the surface acoustic wave filter in accordance with a preferred embodiment of the present invention.
Figure 6:
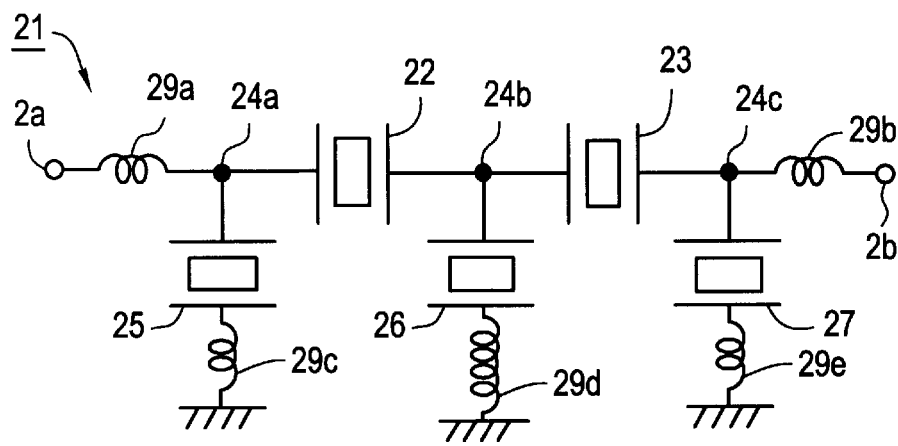
FIG. 6 is a diagram showing an equivalent circuit of the surface acoustic wave filter shown in FIG. 5.

FIG. 5 is a schematic plan view for explaining a second example of the structure of the surface acoustic wave filter in accordance with preferred embodiments of the present invention, and FIG. 6 is a diagram showing an equivalent circuit of this filter.

As is apparent from FIG. 6, a surface acoustic wave filter 21 has a series arm defined by two series arm resonators 22 and 23 located between an input terminal 2a and an output terminal 2b. A parallel arm resonator 25 is inserted in a parallel arm connected between a ground potential and a connection point 24a between the input terminal 2a and the series arm resonator 22. A parallel arm resonator 26 is connected in a parallel arm connected between the ground potential and a connection point 24b located between the series arm resonators 22 and 23. Further, a parallel arm resonator 27 is inserted in a parallel arm which is connected between the ground potential and a connection point 24c located between the series arm resonator 23 and the output terminal 2b.

Inductances 29a–29e are inductance components created by bonding wires and are similar to those shown FIG. 2.

In the surface acoustic wave filter 21, however, the bonding wire 29D described below is preferably longer than bonding wires 29C and 29E so that the inductance 29d is larger than the inductances 29c and 29e. The interelectrostatic capacitances of the parallel arm resonators 25 and 27 provided as first parallel arm resonators in the parallel arms connected to the connection points 24a and 24c between the input and output terminals 2a and 2b and the series arm resonators 22 and 23 located close to the input and output terminals 2a and 2b are preferably set equal to each other. The interelectrostatic capacitance of the second parallel arm resonator 26 provided in the parallel arm connected to the connection point 24b between the series arm resonators 22 and 23 is preferably twice that of the first parallel arm resonators 25 and 27.

As shown in FIG. 5, in the surface acoustic wave filter 21, the surface acoustic wave filter element 30 constructed as described above is placed in an opening 10a of a package 10. The structure of the package 10 is preferably the same as that of surface acoustic wave filter 1. Therefore, the same portions and elements are indicated by the same reference characters, and the description for these same portions and elements will not be repeated.

In the surface acoustic wave filter 21, the series arm resonator 22 is connected via a bonding wire 29A to an external terminal 11b provided as an input terminal, and the series arm resonator 23 is electrically connected via a bonding wire 29B to an external terminal 11e provided as an output terminal. Each of the series arm resonators 22 and 23 preferably is defined by a one port SAW resonator having an IDT at its center and having reflectors placed on the opposite sides thereof, similar to the series arm resonator 3 shown in FIG. 1. The series arm resonators 22 and 23 are connected in series with each other by an electroconductive pattern 31a.

Each of the parallel arm resonators 25, 26, and 27 is preferably defined by a one port SAW resonator having reflectors located on opposite sides thereof. The parallel arm resonator 25 is electrically connected via the bonding wire 29C to an external terminal 11a connected to the ground potential. The parallel arm resonator 26 is electrically connected via the bonding wire 29D to an external terminal 11d connected to the ground potential. The parallel arm resonator 27 is electrically connected via a bonding wire 29E to an external terminal 11f connected to the ground potential.

In the surface acoustic wave filter 21, a piezoelectric substrate 13 is preferably formed of a 36°Y-cut LiTaO$_3$ substrate. Each of the above-described resonators 22, 23, and 25 to 27 and the electroconductive pattern 31a is preferably formed by depositing aluminum on the piezoelectric substrate 13 and by patterning the deposited aluminum.

Ordinarily, impedance matching in a ladder type filter is performed in such a manner that a combination of one series arm resonator and one parallel arm resonator is formed as one block and a plurality of blocks are connected in series by inverting the inputs and outputs. According to this method, the impedance of the parallel arm resonators placed on the input and output sides is twice that of the other parallel arm resonators. Accordingly, in the equivalent circuit shown in FIG. 6, if the impedance of the second parallel arm resonator 26 is ½ of that of the first parallel arm resonators 25 and 27, impedance matching is achieved.

In this case, based on equation (4) shown above, a change in the resonant frequency of the parallel arm resonator 26 can be maximized by increasing the length of the bonding wire 29D connecting the parallel arm resonator 26 to the ground potential. In this manner, the frequency range in which the amount of attenuation is large on the low-frequency side of the passband can be extended. It can therefore be understood that the surface acoustic wave filter 21 can have an extended frequency range through which the amount of attenuation is large on the low-frequency side of the passband, as does the surface acoustic wave filter 1, by increasing the length of the bonding wire for the parallel arm resonator 26 connected to the ground potential in the structure in which the electrostatic capacitance of the parallel arm resonator 26 provided as the second parallel arm resonator in the parallel arm connected to the connection point between the series arm resonators is relatively increased.

Figure 7:
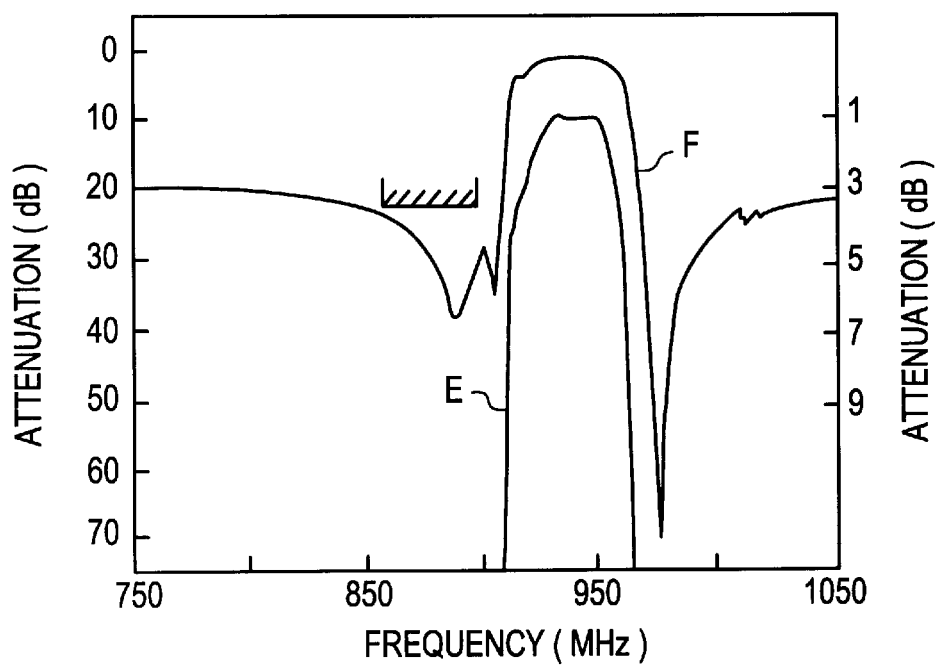
FIG. 7 is a diagram showing an attenuation-frequency characteristic of the surface acoustic wave filter shown in FIG. 5.
Figure 14:
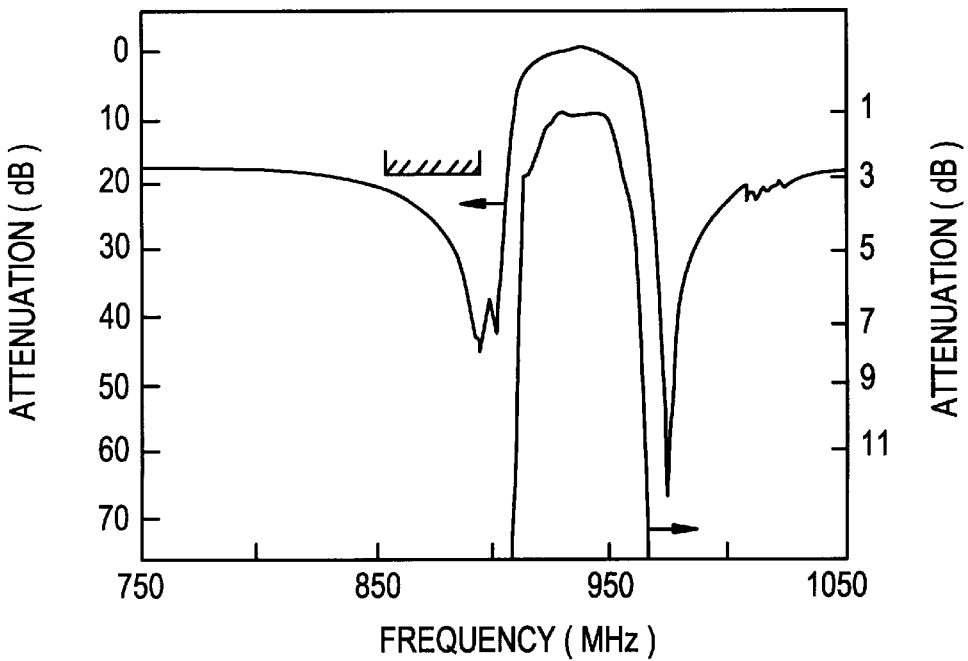
FIG. 14 is a diagram showing an attenuation-frequency characteristic of a surface acoustic wave filter according to a comparative example.

FIG. 7 is a diagram showing an attenuation-frequency characteristic of the surface acoustic wave filter 21. A characteristic curve indicated by solid line E is obtained by enlarging on the right-hand scale an essential portion of the characteristic curve indicated by solid line F. The characteristic shown in FIG. 7 was obtained by setting the following conditions: the number of pairs of electrode fingers of series arm resonators 22 and 23 was 95, the overlap length of the electrode fingers of series arm resonators 22 and 23 was about 60μm, the interelectrostatic capacitance of series arm resonators 22 and 23 was about 2.6 pF, the number of pairs of electrode fingers of parallel arm resonators 25 and 27 was 80, the overlap length of the electrode fingers of parallel arm resonators 25 and 27 was about 60 μm, the interelectrostatic capacitance of parallel arm resonators 25 and 27 was about 2.2 pF, the number of pairs of electrode fingers of parallel arm resonator 26 was about 80, the overlap length of the electrode fingers of parallel arm resonator 26 was about 120 μm, the interelectrostatic capacitance of parallel arm resonator 26 was about 4.42 pF, the length of bonding wire 29D was about 2 mm, and the length of bonding wires 29C and 29E was about 1 mm. In this structural example, as is apparent from comparison between the characteristic shown in FIG. 7 and a characteristic shown in FIG. 14, the amount of attenuation can be increased by about 5 dB on the low-frequency side of the passband.

Figure 8:
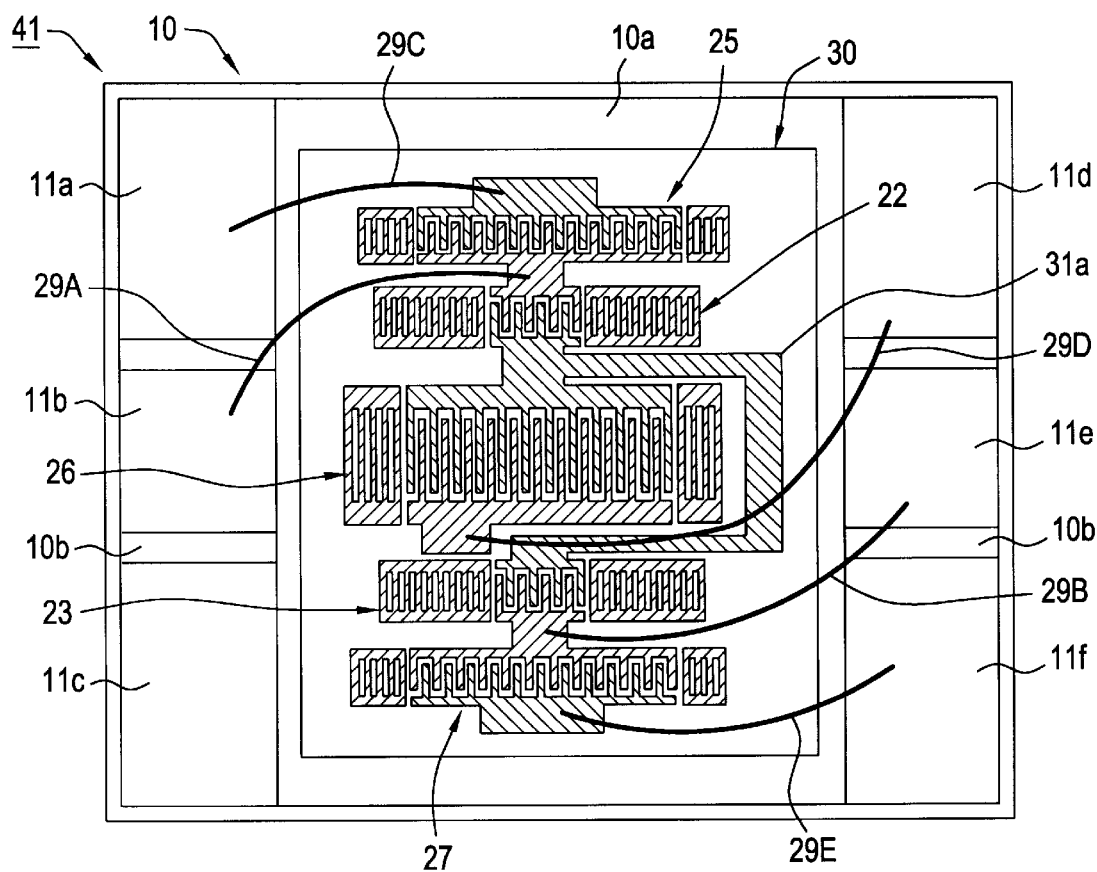
FIG. 8 is a schematic plan view for explaining a third example of the structure of the surface acoustic wave filter in accordance with a preferred embodiment of the present invention.

FIG. 8 is a schematic plan view for explaining a third example of the structure of the surface acoustic wave filter in accordance with preferred embodiments of the present invention. A surface acoustic wave filter 41 of the third structural example has a 5-element structure including three parallel arm resonators and two series arm resonators, and has the same physical construction as the structural example shown in FIG. 5. Portions and elements of this example corresponding to those shown in FIG. 5 are indicated by the same reference characters and the description for these same portions and elements will not be repeated.

The surface acoustic wave filter 41 differs from the surface acoustic wave filter 21 in that the electrostatic capacitance of the second parallel arm resonator 26 is preferably quadruple to that of the parallel arm resonators 25 and 27 provided as first parallel arm resonators. That is, the surface acoustic wave filter 41 is preferably arranged in the same manner as the surface acoustic wave filter 21 shown in FIG. 5 except that the electrode area of the parallel arm resonator 26 is quadruple to that of the parallel arm resonators 25 and 27.

In the surface acoustic wave filter 21 in the second structural example, the electrostatic capacitance of the second parallel arm resonator 26 is twice that of the first parallel arm resonators 25 and 27 to effect impedance matching in the passband. In the second structural example, however, there is a need to add a large inductance in order to extend the attenuation region. On the other hand, packages for surface acoustic wave filters have been made increasingly smaller year by year, and there is a limit to the reduction in the size of inductance elements inserted with bonding wires in the above-described manner. Therefore, there is a need to change a resonant frequency by adding a smaller inductance.

In the third structural example, to satisfy the above-described requirement, the electrostatic capacitance of the parallel arm resonator 26 is further increased while the electrostatic capacitance of the first parallel arm resonators 25 and 27 is reduced, thereby increasing the amount of change in the resonant frequency of the second parallel arm resonator 26. In this manner, the frequency range in which the amount of attenuation is large in the stop band on the low-frequency side of the passband is greatly increased. Ideally, however, the electrostatic capacitance ratio of the second parallel arm resonator 26 and the first parallel arm resonators 25 and 27 is preferably set to about 2:1 for impedance matching in the passband, as described above. If the impedance difference becomes excessively large, the above-described impedance matching cannot be effected. Therefore, the range of capacitance ratio practically available is naturally restricted if impedance matching is taken into consideration.

Figure 9:
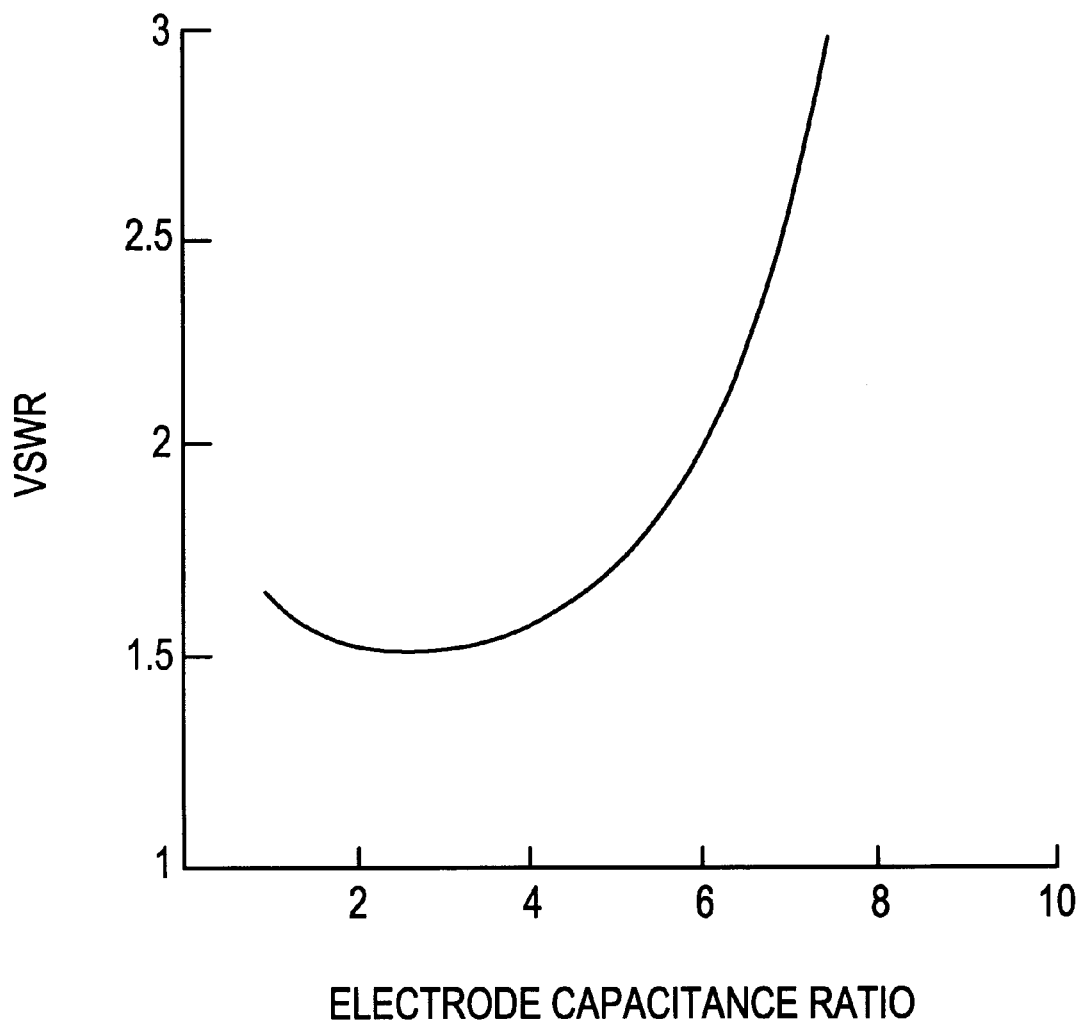
FIG. 9 is a diagram showing the relationship between the electrostatic capacitance ratio of the first and second parallel arm resonators and VSWR.

FIG. 9 shows changes in VSWR (voltage standing wave ratio) when the electrostatic capacitance ratio of the central second parallel arm resonator 26 and the first parallel arm resonators 25 and 27 on the opposite sides is changed. Ordinarily, with respect to high-frequency filters, it is desirable that the VSWR is not higher than 2. However, as is apparent from FIG. 9, the VSWR increases abruptly when the electrostatic capacitance ratio exceeds 6. As can be understood from this discovery, it is desirable to set the ratio of the electrostatic capacitance of the second parallel arm resonator to the electrostatic capacitance of the first parallel arm resonators to a value not larger than 6.

As described above, the electrostatic capacitance of the second parallel arm resonator is increased within such a range that the VSWR value does not exceed 2, thereby extending the frequency range in which the amount of attenuation is large in the rejection region on the low-frequency side of the passband. Then, if the length of the bonding wire connected to the second parallel arm resonator is increased, the resonant frequency of the second parallel arm resonator can be further reduced. Thus, the frequency range in which the amount of attenuation is large is greatly expanded in the low-frequency-side rejection region.

Figure 10:
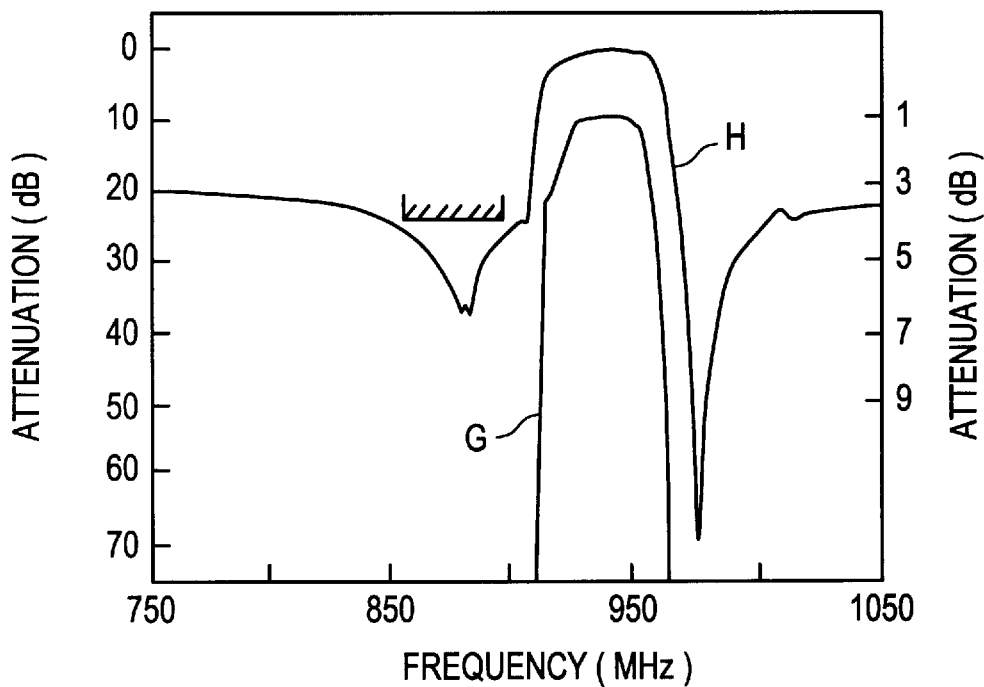
FIG. 10 is a diagram showing an attenuation-frequency characteristic of the surface acoustic wave filter shown in FIG. 8.
Figure 12:
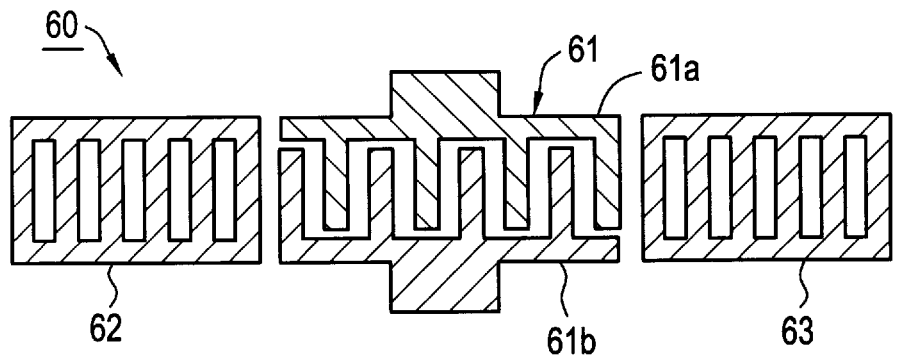
FIG. 12 is an enlarged plan view of a one port SAW resonator.

FIG. 10 shows an attenuation-frequency characteristic of the surface acoustic wave filter 41. A characteristic curve indicated by solid line G is obtained by enlarging on the right-hand scale an essential portion of the characteristic curve indicated by solid line H.

It can be understood from FIG. 10 that the amount of attenuation in the low-frequency-side rejection region can also be increased by about 5 dB in the surface acoustic wave filter 41 of the third structural example.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:

a substrate;

a surface acoustic wave filter element having a plurality of series arm resonators and plurality of parallel arm resonators arranged on the substrate so as to define a ladder type filter circuit having a series arm located between input and output terminals and a plurality of parallel arms located between the series arm and a ground potential;

a package having said surface acoustic wave filter element provided therein and having a plurality of external terminals connected to said surface acoustic wave filter element; and a plurality of bonding wires which respectively connect the input and output terminals and the ground potential terminal of said surface acoustic wave filter element to the plurality of external terminals of said package;

wherein an electrostatic capacitance of at least one of said plurality of parallel arm resonators is larger than an electrostatic capacitance of others of said plurality of parallel arm resonators, and a length of the bonding wire connected between the parallel arm resonator having the larger electrostatic capacitance and one of the external terminals provided on the package and connected to the ground potential is greater than a length of others of the bonding wires connected between the other parallel arm resonators which do not have the larger electrostatic capacitance and others of the external terminals provided on the package and connected to the ground potential; wherein said surface acoustic wave filter element has a plurality of series arm resonators and a plurality of parallel arm resonators, a first of said parallel arm resonators is provided in a parallel arm connected to a connection point located between the input terminal or the output terminal of said surface acoustic wave filter element and one of the series arm resonators located close to the input or the output terminal, a second of said parallel arm resonators is provided in the parallel arm connected to a connection point located between the series arm resonators, the electrostatic capacitance of the second parallel arm resonator is larger than the electrostatic capacitance of the first parallel arm resonator; and the first parallel arm resonator is provided in each of the parallel arm connected to the connection point between the input terminal and the series arm resonator located close to the input terminal and the parallel arm connected to the connection point between the output terminal and the series arm resonator located close to the output terminal, and wherein the electrostatic capacitance of the second parallel arm resonator is larger than a value that is twice the electrostatic capacitance of the first parallel arm resonator and not laraer than a value that is six times larger than the electrostatic capacitance of the first parallel arm resonator.

2. A surface acoustic wave filter according to claim 1, wherein the electrostatic capacitance of said at least one of said plurality of parallel arm resonators is about two times to about six times larger than that of said others of said plurality of parallel arm resonators.

3. A surface acoustic wave filter according to claim 2, wherein an overlap length of electrode fingers or a number of pairs of electrode fingers in an interdigital transducer of said at least one of said plurality of parallel arm resonators is about two times to about six times larger than that in said others of said parallel arm resonators.

4. A surface acoustic wave filter according to claim 1, wherein the length of the bonding wire connecting the second parallel arm resonator and the external terminal provided on the package and connected to the ground potential is greater than the length of the bonding wire connecting the first parallel arm resonator and the external terminal provided on the package and connected to the ground potential.

5. A surface acoustic wave filter according to claim 1, wherein said substrate comprises a piezoelectric substrate made of one of a piezoelectric single crystal of $LiNbO_3$, $LiTaO_3$ or quartz and a piezoelectric ceramic, lead titanate or zirconate piezoelectric ceramic or a piezoelectric thin film thereof.

6. A surface acoustic wave filter comprising:

a substrate;

a surface acoustic wave filter element having a plurality of series arm resonators and plurality of parallel arm resonators arranged on the substrate so as to define a ladder type filter circuit having a series arm located between input and output terminals and a plurality of parallel arms located between the series arm and a ground potential;

a package having said surface acoustic wave filter element provided therein and having a plurality of external terminals connected to said surface acoustic wave filter element; and a plurality of bonding wires which respectively connect the input and output terminals and the ground potential terminal of said surface acoustic wave filter element to the plurality of external terminals of said package; wherein an electrostatic capacitance of at least one of said plurality of parallel arm resonators is larger than an electrostatic capacitance of others of said plurality of parallel arm resonators, and a length of the bonding wire connected between the parallel arm resonator having the larger electrostatic capacitance and one of the external terminals provided on the package and connected to the ground potential is greater than a length of others of the bonding wires connected between the other parallel arm resonators which do not have the larger electrostatic capacitance and others of the external terminals provided on the package and connected to the ground potential; and said plurality of parallel arm resonators include first, second and third parallel arm resonators, the electrostatic capacitance of the second parallel arm resonator is at least about 2.5 times that of the first and third parallel arm resonators.

7. A surface acoustic wave filter comprising:

a substrate;

a surface acoustic wave filter element having a plurality of series arm resonators and a plurality of parallel arm resonators arranged on the substrate so as to define a ladder type filter circuit having a series arm located between input and output terminals and a plurality of parallel arms located between the series arm and a ground potential;

a package having said surface acoustic wave filter element provided therein and having a plurality of external terminals connected to said surface acoustic wave filter element; and a plurality of bonding wires which respectively connect the input and output terminals and the ground potential terminal of said surface acoustic wave filter element to the plurality of external terminals of said package;

wherein an electrostatic capacitance of at least one of said plurality of parallel arm resonators is larger than an electrostatic capacitance of at least one other of said plurality of parallel arm resonators, and a length of the bonding wire connected between one of the parallel arm resonators and one of the external terminals provided on the package and connected to the ground potential is greater than a length of at least one other of the bonding wires connected between the other parallel arm resonators and others of the external terminals provided on the package and connected to the ground potential; wherein said surface acoustic wave filter element has a plurality of series arm resonators and a plurality of parallel arm resonators, a first of said parallel arm resonators is provided in a parallel arm connected to a connection point located between the input terminal or the output terminal of said surface acoustic wave filter element and one of the series arm resonators located close to the input or the output terminal, a second of said parallel arm resonators is provided in the parallel arm connected to a connection point located between the series arm resonators, the electrostatic capacitance of the second parallel arm resonator is larger than the electrostatic capacitance of the first parallel arm resonator; and the first parallel arm resonator is provided in each of the parallel arm connected to the connection point between the input terminal and the series arm resonator located close to the input terminal and the parallel arm connected to the connection point between the output terminal and the series arm resonator located close to the output terminal, and wherein the electrostatic capacitance of the second parallel arm resonator is larger than a value that is twice the electrostatic capacitance of the first parallel arm resonator and not larger than a value that is six times larger than the electrostatic capacitance of the first parallel arm resonator.

8. A surface acoustic wave filter according to claim 7, wherein the length of the bonding wire connecting the second parallel arm resonator and the external terminal provided on the package and connected to the ground potential is greater than the length of the bonding wire connecting the first parallel arm resonator and the external terminal provided on the package and connected to the ground potential.

9. A surface acoustic wave filter according to claim 7, wherein said substrate comprises a piezoelectric substrate made of one of a piezoelectric single crystal of $LiNbO_3$, $LiTaO_3$ or quartz and a piezoelectric ceramic, lead titanate or zirconate piezoelectric ceramic or a piezoelectric thin film thereof.

10. A surface acoustic wave filter according to claim 7, wherein the electrostatic capacitance of said at least one of said plurality of parallel arm resonators is about two times to about six times larger than that of said at least one other of said plurality of parallel arm resonators.

11. A surface acoustic wave filter according to claim 10, wherein an overlap length of electrode fingers or a number of pairs of electrode fingers in an interdigital transducer of said at least one of said plurality of parallel arm resonators is about two times to about six times larger than that in said at least one other of said parallel arm resonators.

12. A surface acoustic wave filter comprising:

a substrate;

a surface acoustic wave filter element having a plurality of series arm resonators and a plurality of parallel arm resonators arranged on the substrate so as to define a ladder type filter circuit having a series arm located between input and output terminals and a plurality of parallel arms located between the series arm and a ground potential;

a package having said surface acoustic wave filter element provided therein and having a plurality of external terminals connected to said surface acoustic wave filter element; and a plurality of bonding wires which respectively connect the input and output terminals and the ground potential terminal of said surface acoustic wave filter element to the plurality of external terminals of said package; wherein an electrostatic capacitance of at least one of said plurality of parallel arm resonators is larger than an electrostatic capacitance of at least one other of said plurality of parallel arm resonators, and a length of the bonding wire connected between one of the parallel arm resonators and one of the external terminals provided on the package and connected to the ground potential is greater than a length of at least one other of the bonding wires connected between the other parallel arm resonators and others of the external terminals provided on the package and connected to the ground potential; and said plurality of parallel arm resonators include first, second and third parallel arm resonators, the electrostatic capacitance of the second parallel arm resonator is at least about 2.5 times that of the first and third parallel arm resonators.

* * * * *